United States Patent
Lee et al.

(10) Patent No.: US 7,495,975 B2
(45) Date of Patent: Feb. 24, 2009

(54) MEMORY SYSTEM INCLUDING ON-DIE TERMINATION UNIT HAVING INDUCTOR

(75) Inventors: Jae-Jun Lee, Seongnam-si (KR); Kwang-Soo Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 11/377,665

(22) Filed: Mar. 17, 2006

(65) Prior Publication Data

US 2007/0030024 A1 Feb. 8, 2007

(30) Foreign Application Priority Data

Jul. 22, 2005 (KR) .................. 10-2005-0066962

(51) Int. Cl.
*G11C 29/00* (2006.01)

(52) U.S. Cl. ............... 365/200; 365/51; 365/63; 326/30

(58) Field of Classification Search .......... 326/30, 326/86; 365/51, 63, 222, 233, 189.09; 327/108
See application file for complete search history.

(56) References Cited

U.S. PATENT DOCUMENTS

| | | | |
|---|---|---|---|
| 6,026,456 A | 2/2000 | Ilkbahar | |
| 6,323,673 B1 | 11/2001 | Starr | |
| 2003/0218477 A1 | 11/2003 | Jang et al. | |
| 2004/0036498 A1 | 2/2004 | Park et al. | |
| 2004/0100837 A1* | 5/2004 | Lee | 365/200 |
| 2005/0068800 A1* | 3/2005 | Fahmy et al. | 365/63 |

FOREIGN PATENT DOCUMENTS

JP 2000-307410 11/2000

OTHER PUBLICATIONS

Korean Office Action dated Jun. 30, 2006 and English translation.

* cited by examiner

*Primary Examiner*—Vibol Tan
(74) *Attorney, Agent, or Firm*—Harness, Dickey & Pierce, P.L.C.

(57) ABSTRACT

Provided is a memory system with an inductor. In the memory system, the inductor is connected to an on-die termination unit of a memory chip, thereby realizing constant gain characteristics without respect to a variation in an operating frequency. The inductor of the on-die termination unit may be embodied by connecting a wire bonding, a package line pattern, a PCB line pattern, a wire line, and/or an inductor device to pads of the memory chip.

12 Claims, 7 Drawing Sheets

MEMORY SYSTEM INCLUDING ON-DIE TERMINATION UNIT HAVING INDUCTOR

PRIORITY STATEMENT

This application claims the priority of Korean Patent Application No. 10-2005-0066962, filed on Jul. 22, 2005, in the Korean Intellectual Property Office, the entire contents of which is incorporated herein in its entirety by reference.

BACKGROUND

1. Field of the Invention

Example embodiments of the present invention relate to a memory system, and more particularly, to a memory system including an on-die termination unit having an inductor.

2. Description of the Related Art

A line used to transmit a signal to and/or receive a signal from a memory system may be terminated using terminal resistance to suppress the reflection of a signal, caused at a receiving side and/or a transmitting side. Signal reflection may degrade signal integrity (SI) and may significantly degrade the performance of a memory system supporting high-speed data transmission.

In conventional memory systems, input/output (I/O) terminals of a memory controller and/or a DRAM may be embodied as on-die termination (ODT) units terminated by termination resistance. The termination resistance may be set to match the impedance in a transmission line.

A transmission line connected to a receiver of a receiving side may contain parasitic capacitance caused by input capacitance in the receiver and/or junction capacitance in a driver. The parasitic capacitance may cause the termination resistance to vary in response to a variation in an operating frequency of a memory system. Accordingly the termination resistance may not be substantially fixed if the termination resistance varies.

If a termination resistance in the I/O terminal is maintained at a constant value, a gain in the I/O terminal may be maintained at a constant value even if the operating frequency is changed from a low frequency to a high frequency. However, if a termination resistance in an I/O terminal varies with a parasitic capacitance, the gain in the I/O terminal may fluctuate.

To reduce and/or remove issues stemming from or relating to a parasitic capacitance and to realize broadband termination, ODT may require inductance. Signal integrity may be improved by adding an inductor into an ODT unit. However, because the size of an inductor is typically large, the addition of the inductor may significantly increase the chip size.

SUMMARY OF THE INVENTION

An example embodiment of the present invention provides a memory chip. The memory chip may include an operating power supply line and a power supply line for exclusive use in an on-die termination (ODT) unit, which are separate from each other.

An example embodiment of the present invention provides a memory system. The memory system may include an on-die termination unit having an inductor.

An example embodiment of the present invention provides a memory chip. The memory chip may include a first power supply line connected to a first power supply pad; a second power supply line connected to a second power supply pad; at least one data input/output pad; a driver connected to the first power supply line, the driver outputting data to the at least one data input/output pad; and an on-die termination unit connected to the second power supply line, the on-die termination unit having output characteristics which match impedance in a transmission line connected to the at least one data input/output pad.

The first power supply line may be an operating power supply line of the memory chip, and the second power supply line may be a power supply line for exclusive use in the on-die termination unit.

An example embodiment of the present invention provides a memory system. The memory system may include a memory chip comprising a plurality of first power supply pads and a plurality of second power supply pads; and a package board including a plurality of third power supply pads which are wire-bonded to the first and second power supply pads. The memory chip may include a first power supply line connected to the first power supply pads; a second power supply line connected to the second power supply pads; at least one data input/output pad connected to a transmission line; a driver connected to the first power supply line and the at least one data input/output pad, the driver outputting data to the at least one data input/output pad; and an on-die termination unit connected between the second power supply line and the data input/output pad, the on-die termination unit having output characteristics matching impedance in the transmission line.

An example embodiment of the present invention provides a memory system. The memory system may include a memory chip including a plurality of first power supply pads and a plurality of second power supply pads; and a package board comprising a plurality of third power supply pads and a plurality of fourth power supply pads which are respectively wire-bonded to the first and second power supply pads, and a plurality of package balls connected to the third and fourth power supply pads via a package line pattern.

An example embodiment of the present invention provides a memory system. The memory system may include a memory chip including a plurality of first power supply pads and a plurality of second power supply pads; a package board including a plurality of third power supply pads and a plurality of fourth power supply pads which are respectively wire-bonded to the first and second power supply pads, and a plurality of package balls connected to the third and fourth power supply pads via a package line pattern; and a power supply plane mounted on the package board and including a power supply terminal connected via the package balls and a wire line.

According to an example embodiment of the present invention, the package balls may be ball grid array balls.

According to an example embodiment of the present invention, a memory chip may further include an inductor device connected between the package balls and the power supply terminal via the wire line.

An example embodiment of the present invention provides a memory system. The memory system may include a first power supply line connected to at least one first power supply pad; a second power supply line connected to at least one second power supply pad; at least one data input/output pad; a driver connected to the first power supply line, the driver outputting data to the at least one data input/output pad; an on-die termination unit including a first terminal connected to the second power supply line and a second terminal connected to the at least one data input/output pad; and at least one inductor connected to the at least one second power supply pad, the at least one inductor configured to provide an inductance to the on-die termination unit to maintain a substantially constant signal gain in a transmission line connected to the at least one data input/output pad.

In a memory system according to an example embodiment of the present invention, an inductor may be included in an on-die termination unit of a memory chip to obtain stable and constant gain characteristics regardless of a variation in an operating frequency, and the inductor may be embodied by connecting a wire bonding, a package line pattern, a printed circuit board (PCB) line pattern, a wire line, and/or an inductor device to the memory chip. Accordingly, the inclusion of the inductor does not significantly affect the memory chip size.

BRIEF DESCRIPTION OF THE DRAWINGS

The above and other aspects and advantages of the present invention will become more apparent by describing in detail example embodiments thereof with reference to the attached drawings in which.

DETAILED DESCRIPTION OF THE INVENTION

Figure 1:
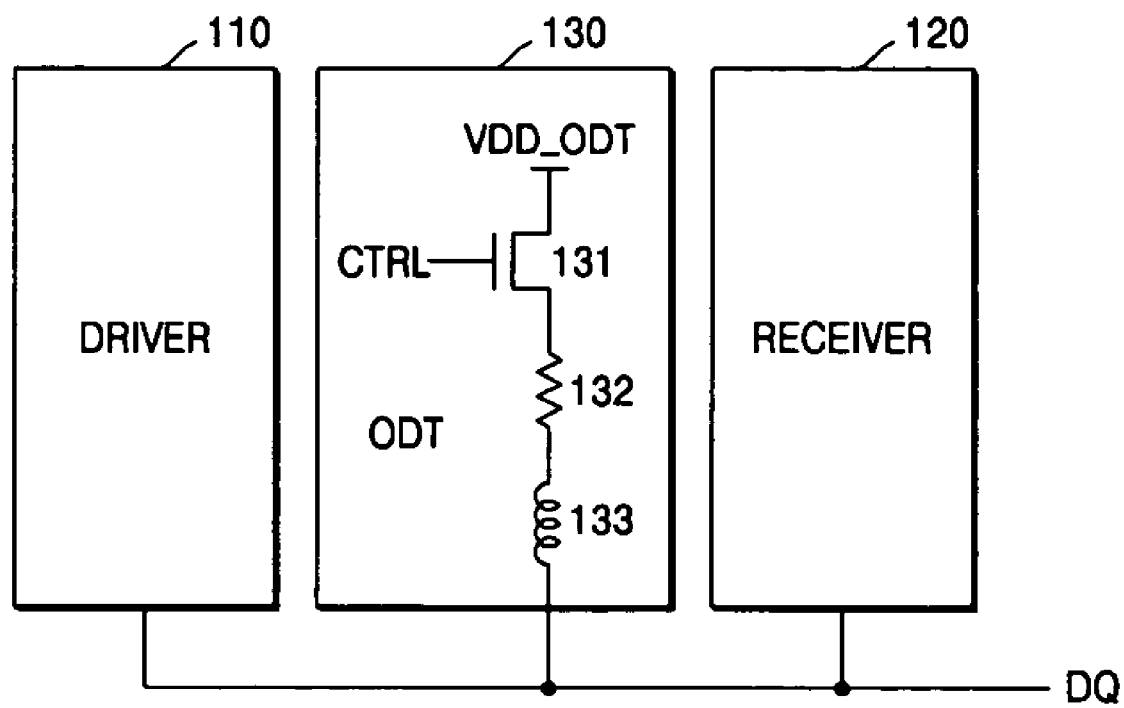
FIG. 1 is a view illustrating an on-die termination (ODT) unit including an inductor according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Now, in order to more specifically describe example embodiments of the present invention, various embodiments of the present invention will be described in detail with reference to the attached drawings. However, the present invention is not limited to the example embodiments, but may be embodied in various forms.

FIG. 1 a view illustrating an on-die termination (ODT) unit including an inductor according to an example embodiment of the present invention. Referring to FIG. 1, a data input/output (I/O) pad DQ may be connected to a driver 110, a receiver 120, and an ODT unit 130.

Although not shown, a driver 110 may include a pull-up circuit and/or a pull-down circuit. A pull-up circuit may apply a high voltage to the data I/O pad DQ by controlling an output resistance value when the pull-up circuit is enabled, and may set the data I/O pad DQ to a high-impedance state when disabled. A pull-down circuit may apply a low voltage to the data I/O pad DQ by controlling a resistance value when the pull-down circuit is enabled, and may set the data I/O pad DQ to a high-impedance state when disabled. The driver 110 may output data to the data I/O pad DQ by timely, selectively enabling built-in pull-up/pull-down circuits.

A receiver 120 may receive the data input via a data I/O pad DQ.

An ODT unit 130 may include a switching transistor 131, a resistor 132, and an inductor 133. The switching transistor 131, resistor 132, and inductor 133 may be connected in series to a first power supply source VDD_ODT as shown in FIG. 1. The switching transistor 131 may be turned on in response to a control signal CTRL to terminate the data I/O pad DQ, and the first power supply source VDD_ODT may apply a voltage to the resistor 132 and the inductor 133. According to an example embodiment of the present invention, if the switching transistor 131 is turned on and a voltage is applied to the resistor 132 and the inductor 133, the driver 110 is disabled and the receiver 120 receives data from the data I/O pad DQ.

Figure 2:
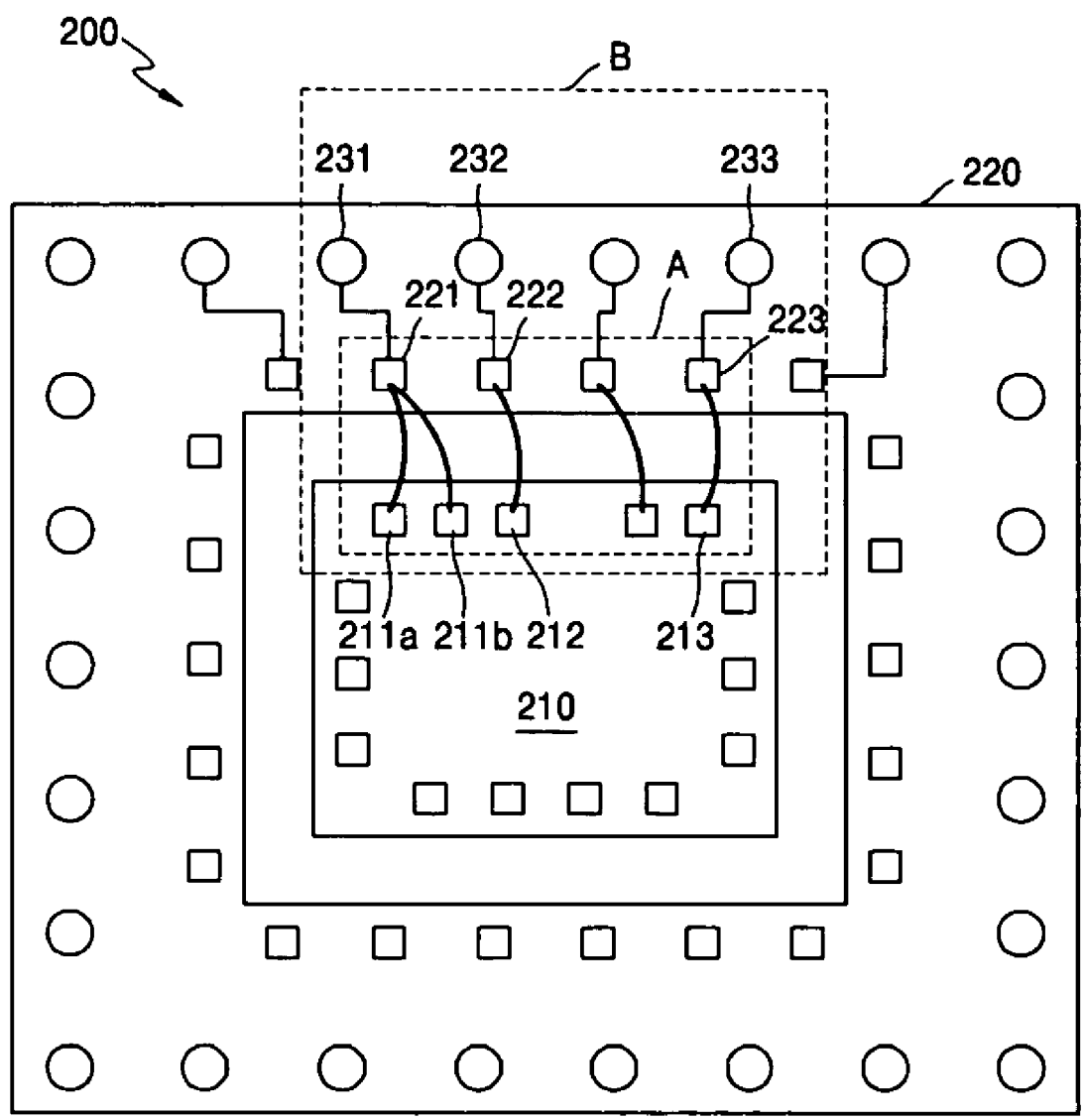
FIGS. 2 and 3 are views illustrating a memory system according to an example embodiment of the present invention.

FIG. 2 is a view illustrating a memory system 200 according to an example embodiment of the present invention. Referring to FIG. 2, a memory system 200 may include a memory chip 210 mounted on a package board 220. First power supply pads 211a, 212, and 213 of the memory chip 210 and a second power supply pad 211b may be connected to third power supply pads 221, 222, and 223 of the package board 220 via wire bonding.

Package board 220 may be a ball grid array (BGA) package. BGA balls 231, 232, and 233 may be connected to the third power supply pads 221, 222 and 223, respectively, via a package line pattern.

Figure 3:
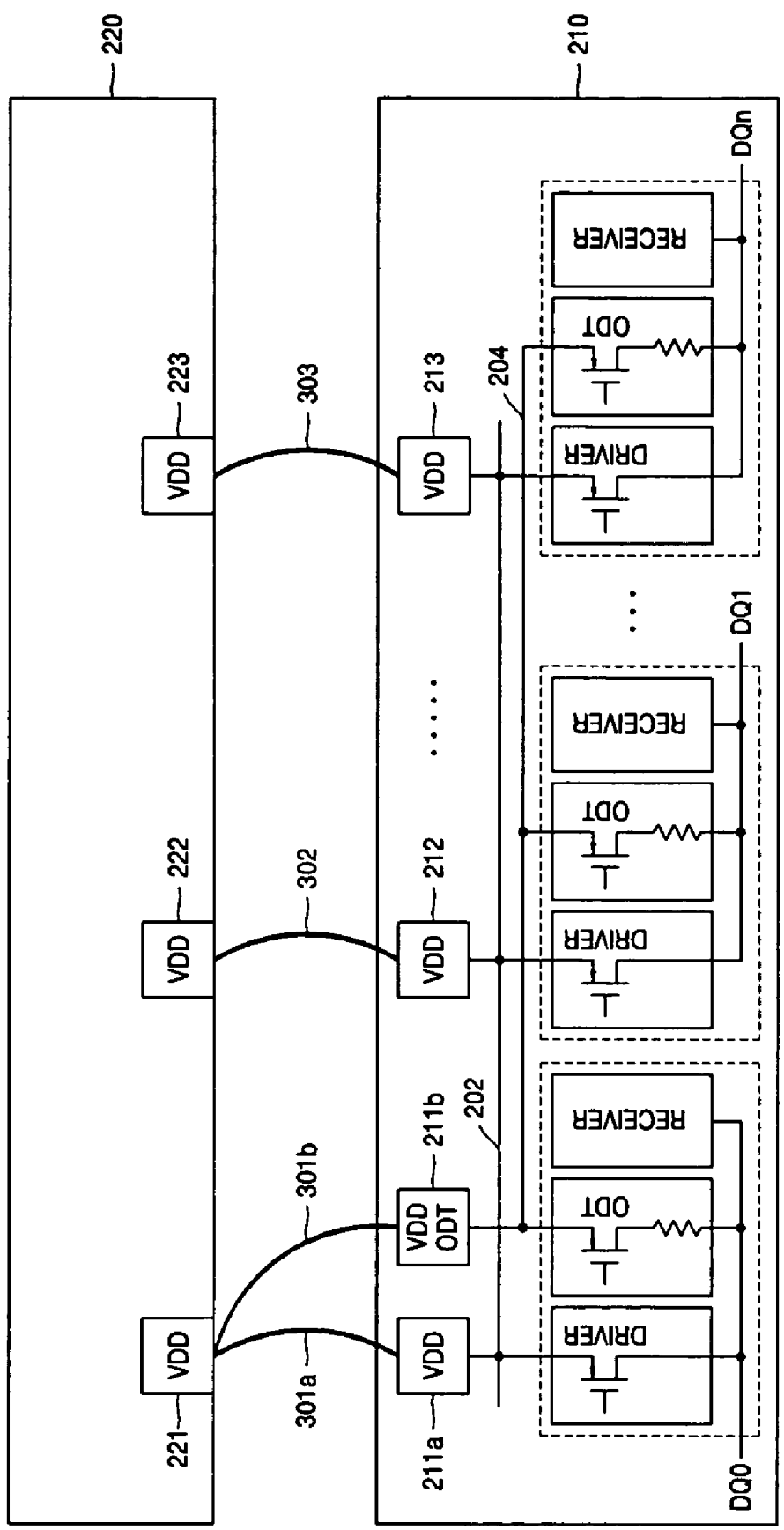

FIG. 3 is a magnified view of section A of the memory system 200 in FIG. 2. In an example embodiment of the present invention as shown in FIG. 3, third power supply pads 221 through 223 of the package board 220 may be operating power supply pads VDD. The third power supply pads 221 through 223 may be connected to the first and second power supply pads 211a, 211b, 212, and 213 via wire bondings 301a, 301b, 302, and 303. For example, the third power supply pad 221 is connected to the first power supply pad 211a and the second power supply pad 211b via the two wire bondings 301a and 301b, respectively.

The first power supply pads 211a, 212, and 213 may be operating power supply pads VDD of the memory chip 210 and may be connected to a first power supply line 202 of the memory chip 210. The second power supply pad 211b may be an ODT power supply pad VDD_ODT of the memory chip 210 and may be connected to a second power supply line 204 of the memory chip 210. Each of a plurality of DQ pads DQ0, DQ1, . . . DQn may be connected to a driver, an ODT unit, and a receiver as previously described with reference to FIG. 1. According to an example embodiment of the present invention, drivers may be connected to the first power supply line 202, and the ODT units may be connected to the second power supply line 204.

Wire bonding 301b connecting a second power supply pad 211b and third power supply pad 221 may act as an inductor of an ODT unit 130.

Figure 4:
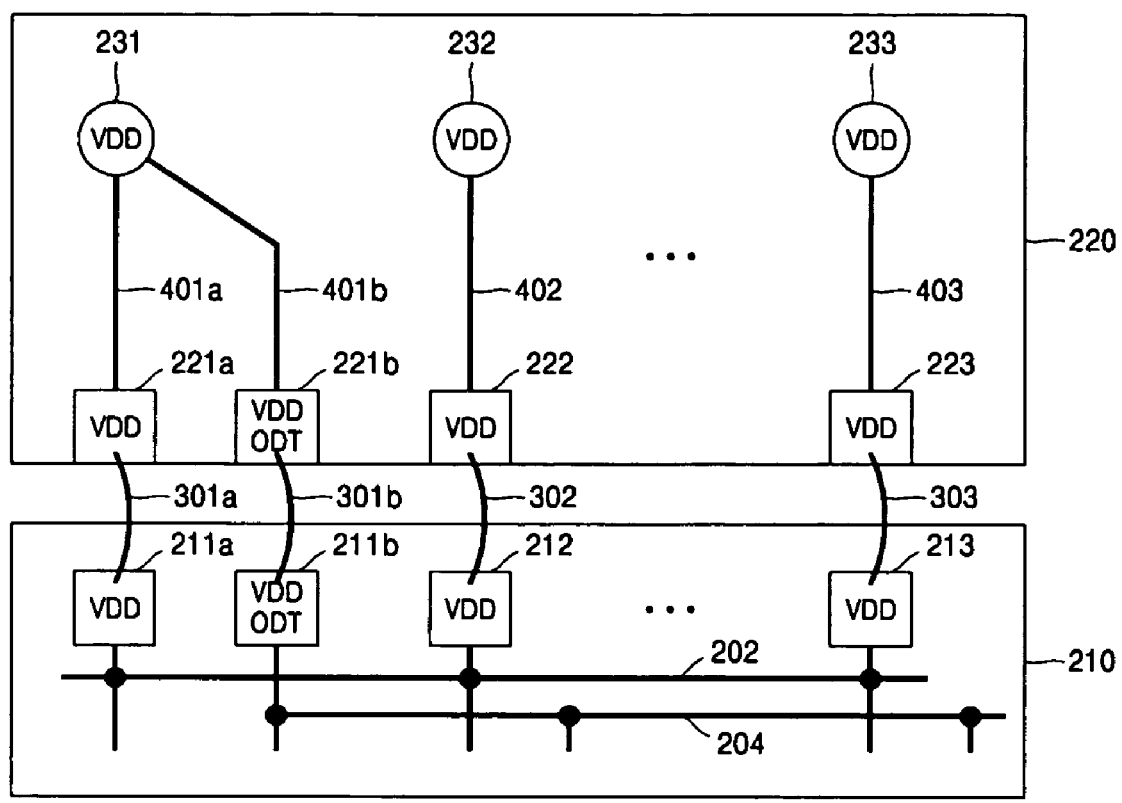
FIG. 4 is a view illustrating a memory system according to an example embodiment of the present invention.

FIG. 4 is a view of a memory system according to an example embodiment of the present invention. The memory system of FIG. 4 will be described with respect to section B of the memory system 200 of FIG. 2. Referring to FIG. 4, BGA balls 231, 232, and 233 are power supply balls. The BGA balls 231, 232 and 233 may be connected to third and fourth power supply pads 221a, 221b, 222, and 223 via package line patterns 401a, 401b, 402, and 403. For example, the BGA ball 231 is connected to the third and fourth power supply pads 221a and pad 221b via the two package line patterns 401a and 401b, respectively.

The third and fourth power supply pads 221a, 221b, 222, and 223 are respectively connected to first and second power supply pads 211a, 211b , 212, and 213 via wire bondings 301a, 301b, 302, 303. Although not shown in FIG. 4, each of the first and second power supply pads 211a, 211b, 212, and 213 may be connected to a driver, an ODT unit, and a receiver as illustrated in FIG. 3.

The package line pattern 401b connecting the BGA ball 231 and the fourth power supply pad 221b, and the wire bonding 301b connecting the fourth power supply pad 221b and the second power supply pad 211b may act as an inductor of an ODT unit 130 of FIG. 1.

Figure 5:
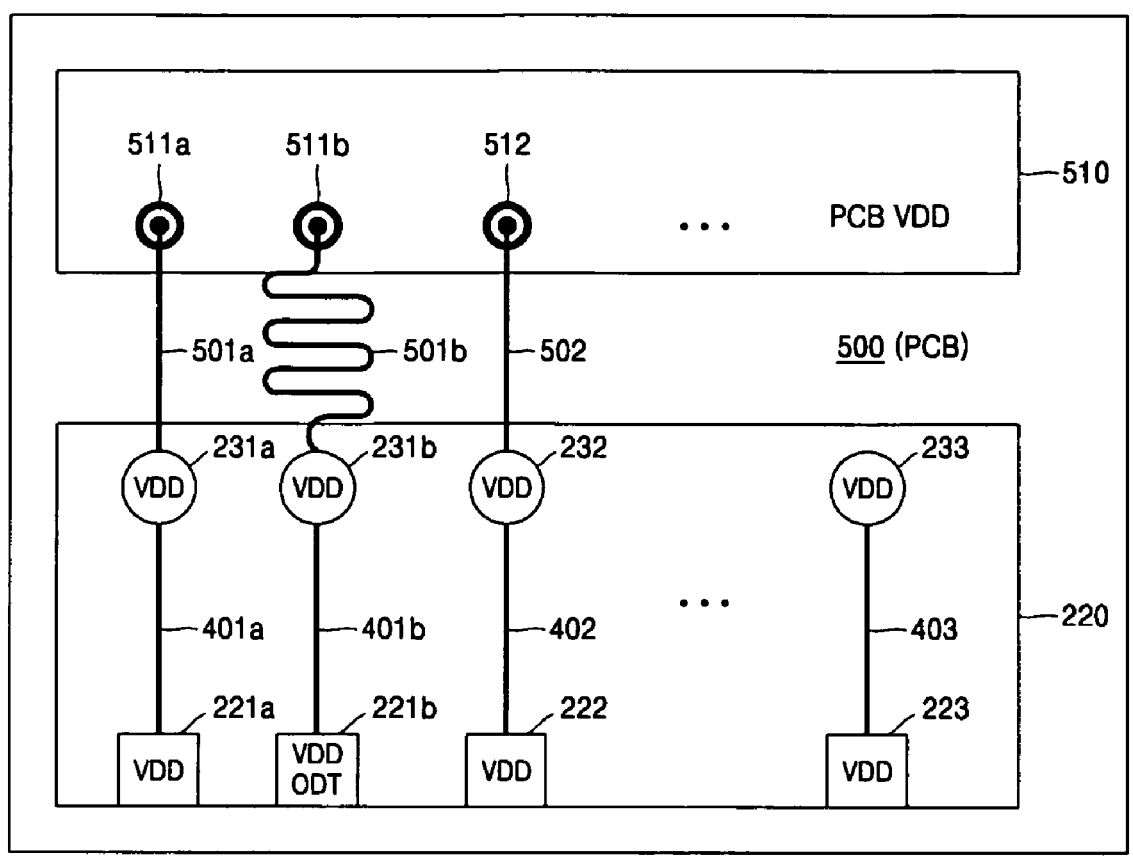
FIG. 5 is a view illustrating a memory system according to an example embodiment of the present invention.

FIG. 5 is a view illustrating a memory system according to an example embodiment of the present invention. Referring to FIG. 5, BGA balls 231a, 231b, 232, and 233 of a package board 220 as shown in FIG. 4, may be connected to a printed circuit board (PCB) VDD plane 510 on a package 500. Power supply terminals 511a and 512 of the PCB VDD plane 510 may be connected to the BGA balls 231a and 232 via PCB line patterns 501a and 502, respectively. A power supply terminal 511b may be connected to the BGA ball 231b via a different length wire line 501b. According to an example embodiment of the present as shown in FIG. 5, wire line 501b is longer than wire lines 501a and 502.

The BGA balls 231a, 231b, 232, and 233 may be connected to third and fourth power supply pads 221a, 221b, 222, 223 via line patterns 401a, 401b, 402, and 403 of the package board 220, respectively. Although not shown, the third and fourth power supply pads 221a, 221b, 222, and 223 are respectively connected to first and second power supply pads 211a, 211b, 212, 213 via wire bondings 301a, 301b, 302, and 303. Each of the first and second power supply pads 211a, 211b, 212, and 213 is connected to a driver, an ODT unit, and a receiver as illustrated in FIG. 3.

A wire line 501b connecting the power supply terminal 511b and the BGA ball 231b, the package line pattern 401b connecting the BGA ball 231b and the fourth power supply pad 221b, and the wire bonding 301b connecting the fourth power supply pad 221b and the second power supply pad 211b may act as an inductor of an ODT unit 130 according to an example embodiment of the present invention.

Figure 6:
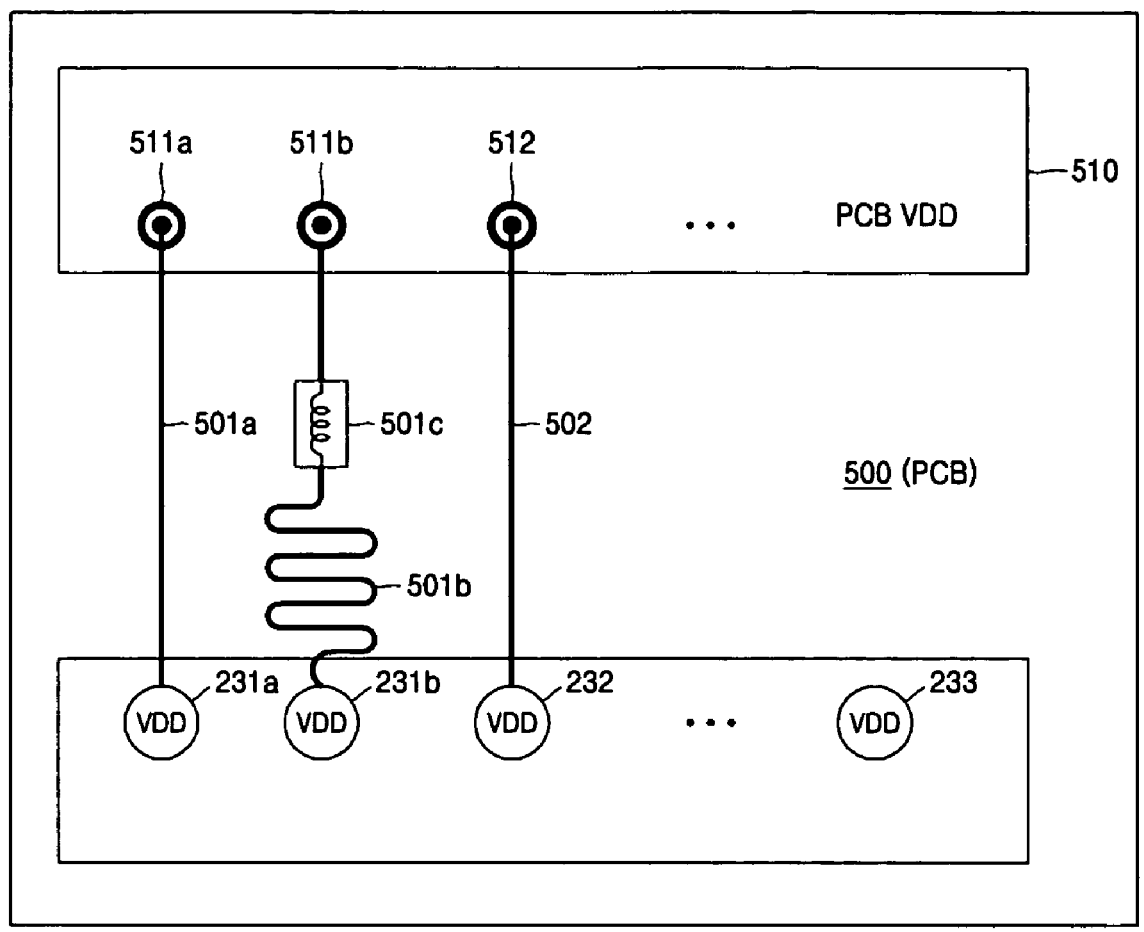
FIG. 6 is a view illustrating a memory system according to an example embodiment of the present invention.

FIG. 6 is a view illustrating a memory system according to an example embodiment of the present invention. Referring to FIG. 6, both a long wire line 501b and an inductor device 501c may be connected between a power supply terminal 511b and a BGA ball 231b, in contrast to the memory system of FIG. 5. Accordingly, although not all shown, the inductor device 501c and wire line 501b connecting the power supply terminal 511b and the BGA ball 231b, a PCB line pattern 401b connecting the BGA ball 231b and a fourth power supply pad 221b, and a wire bonding 301b connecting the fourth power supply pad 221b and a second power supply pad 211b may act as an inductor of an ODT unit 130.

Figure 7:
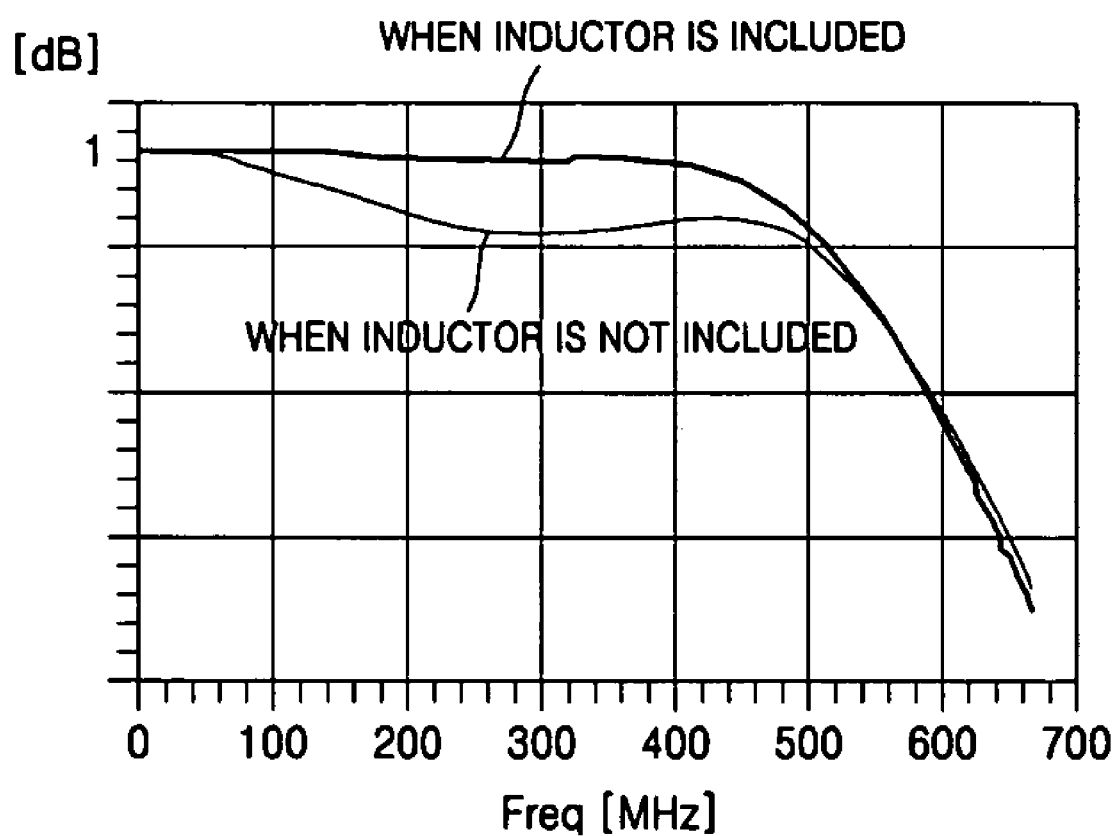
FIG. 7 is a graph illustrating operating characteristics of an ODT unit including an inductor according to an example of the present invention.

FIG. 7 is a graph illustrating operating characteristics of an ODT unit with an inductor according to an example embodiment of the present invention. FIG. 7 illustrates that a signal gain in a transmission line connected to an ODT unit including an inductor according to an example embodiment of the present invention is maintained at a substantially constant value without respect to variation in an operating frequency, whereas a signal gain in an ODT unit that does not include an inductor varies based on the operating frequency.

As described above, according to example embodiments of the present invention, an inductor to be included in an ODT unit may be embodied by connecting a wire bonding, a package line pattern, a PCB line pattern, a wire line, or an inductor device to a memory chip, thereby realizing an inductor without increasing chip size.

While this invention has been particularly shown and described with reference to example embodiments of the present invention, it will be understood by those skilled in the art that various changes in form and details may be made therein without departing from the spirit and scope of the invention as defined by the appended claims.

What is claimed is:

1. A memory chip comprising:
a first power supply line connected to a plurality of first power supply pads;
a second power supply line connected to a plurality of second power supply pads;
at least one data input/output pad;
a driver connected to the first power supply line, the driver outputting data to the at least one data input/output pad;
an on-die termination unit connected to the second power supply line, the on-die termination unit having output characteristics matching impedance in a transmission line connected to the at least one data input/output pad;

a package board including a plurality of third power supply pads which are wire-bonded to the first power supply pads and the second power supply pads;

wherein the first power supply line is connected to the first power supply pads;

the second power supply line is connected to the second power supply pads;

the at least one data input/output pad is connected to the transmission line;

the driver is connected to the first power supply line and the at least one data input/output pad, the driver outputting data to the at least one data input/output pad; and the on-die termination unit connected between the second power supply line and the data input/output pad.

2. The memory chip of claim 1, wherein the first power supply line is an operating power supply line of the memory chip.

3. The memory chip of claim 1, wherein the second power supply line is a power supply line for exclusive use in the on-die termination unit.

4. A memory system comprising:

the memory chip according to claim 1 including a plurality of first power supply pads and a plurality of second power supply pads; and a package board comprising a plurality of third power supply pads and a plurality of fourth power supply pads which are respectively wire-bonded to the first power supply pads and the second power supply pads, and a plurality of package balls connected to the third and fourth power supply pads via a package line pattern, wherein the first power supply line is connected to the first power supply pads;

the second power supply line is connected to the second power supply pads;

the at least one data input/output pad is connected to the transmission line;

the driver is connected to the first power supply line and the at least one data input/output pad, the driver outputting data to the at least one data input/output pad; and the on-die termination unit is connected between the second power supply line and the data input/output pad.

5. The memory system of claim 4, further comprising:

a power supply plane mounted on the package board and including a power supply terminal connected via the package balls and a wire line.

6. The memory system of claim 5, wherein the package balls are ball grid array balls.

7. The memory system of claim 6, further comprising an inductor device connected between the package balls and the power supply terminal via the wire line.

8. A memory system comprising:

a first power supply line connected to at least one first power supply pad;

a second power supply line connected to at least one second power supply pad;

at least one data input/output pad;

a driver connected to the first power supply line, the driver outputting data to the at least one data input/output pad;

an on-die termination unit including a first terminal connected to the second power supply line and a second terminal connected to the at least one data input/output pad;

at least one inductor connected to the at least one second power supply pad, the at least one inductor configured to provide an inductance to the on-die termination unit to maintain a substantially constant signal gain in a transmission line connected to the at least one data input/output pad; and a package board including at least one third power supply pad and the at least one inductor includes a wire bonding connected between the at least one second power supply pad and the at least one third power supply pad.

9. The memory system of claim 8, further comprising:

at least one fourth power supply pad and the at least one inductor further includes a wire bonding connected between the at least one third power supply pad and the at least one fourth power supply pad.

10. The memory system of claim 9, wherein the at least one third power supply pad is a conductive bump.

11. The memory system of claim 9, further comprising:

a power supply plane mounted on the package board and including at least one power supply terminal and the inductor further includes a wire connected between the at least one power supply terminal and the third power supply.

12. The method of claim 11, wherein the length of the wire is determined based on an inductance the on-die termination unit uses to maintain a substantially constant signal gain in a transmission line connected to the at least one data input/output pad.

* * * * *